United States Patent

[11] 3,624,452

[72] Inventors John M. Hayward; Christopher E. Pilkington, both of London, England

[21] Appl. No. 873,383
[22] Filed Nov. 3, 1969
[45] Patented Nov. 30, 1971
[73] Assignee Westinghouse Brake & Signal Company Limited London, England
[32] Priority Nov. 26, 1968
[33] Great Britain
[31] 55,964/68

[54] HEAT SINK MOUNTINGS FOR RECTIFIER DEVICES
6 Claims, 4 Drawing Figs.

[52] U.S. Cl. .......... 317/100, 317/234 A
[51] Int. Cl. .......... H01l 1/12
[50] Field of Search .......... 317/100, 234 (1); 174/DIG. 5, 15, 16

[56] References Cited

UNITED STATES PATENTS

| | | | |
|---|---|---|---|
| 3,280,389 | 10/1966 | Martin | 317/234 |
| 3,339,015 | 8/1967 | Gunthel | 174/168 |
| 3,364,987 | 1/1968 | Per-Ake | 313/234 |

FOREIGN PATENTS

| | | | |
|---|---|---|---|
| 648,743 | 11/1962 | Italy | 317/234 |
| 1,052,862 | 12/1966 | Great Britain | 317/234 |
| 1,184,000 | 12/1964 | Germany | 317/234 |

*Primary Examiner*—Thomas J. Kozma
*Assistant Examiner*—Gerald P. Tolin
*Attorney*—Larson, Taylor and Hinds

ABSTRACT: A mounting for a semiconductor device includes a leaf spring capable of producing a predetermined pressure at a point along the length thereof responsive to a given deflection of the point, the spring bearing on a convex surface of a block and the semiconductor device being clamped between the block and a base member in the form of a heat sink. Variation in the clamping pressure is provided by tensioning screws and a gap between the leaf spring and the surface of the block is accessible during the application of tension so that a predetermined deflection of the spring can be gauged and a selected pressure thus applied to the device.

HEAT SINK MOUNTINGS FOR RECTIFIER DEVICES

This invention relates to mountings for rectifier devices and relates particularly to mountings for rectifier devices of a type which require the application of substantial pressure in mounting them on a heat sink.

Semiconductor diodes and semiconductor controllable rectifier devices are now being manufactured in which in order to achieve adequate thermal and electrical conduction between the semiconductor element of the device and an associated heat sink, substantial pressure is required to be exerted on the semiconductor element. Hitherto it has largely been the practice to mount the semiconductor element in an enclosure by a technique which has become known as compression bonding. This involves the use of suitable loading means within the enclosure of the device. More recently, the practice of exerting pressure from the outside on a previously encapsulated device has been adapted, this being effected during the mounting of the device on its cooling fin or heat sink.

According to the invention there is provided a mounting for a rectifier device comprising a leaf spring capable of producing a predetermined pressure at a point along its length as a result of a given deflection of the said point, the spring bearing on a convex surface of a block between which and a base member the device of a is clamped by virtue of tension between the leaf spring nd the base member, the leaf spring and the block being accessible during application of tension to the tension means whereby a predetermined deflection of the spring can be gauged.

The base member is preferably a heat sink for the device and the block is preferably of insulating material to provide electrical insulation between an adjacent face of the device and the leaf spring. A further feature of the invention is that it enables the clamping of a contact member between the block and the device to provide an electrical connection to the device and by providing means on the contact member which cooperates with means on the block and the device, precise positioning of the device in relation to the block may be achieved.

Figures 1, 2, 3:
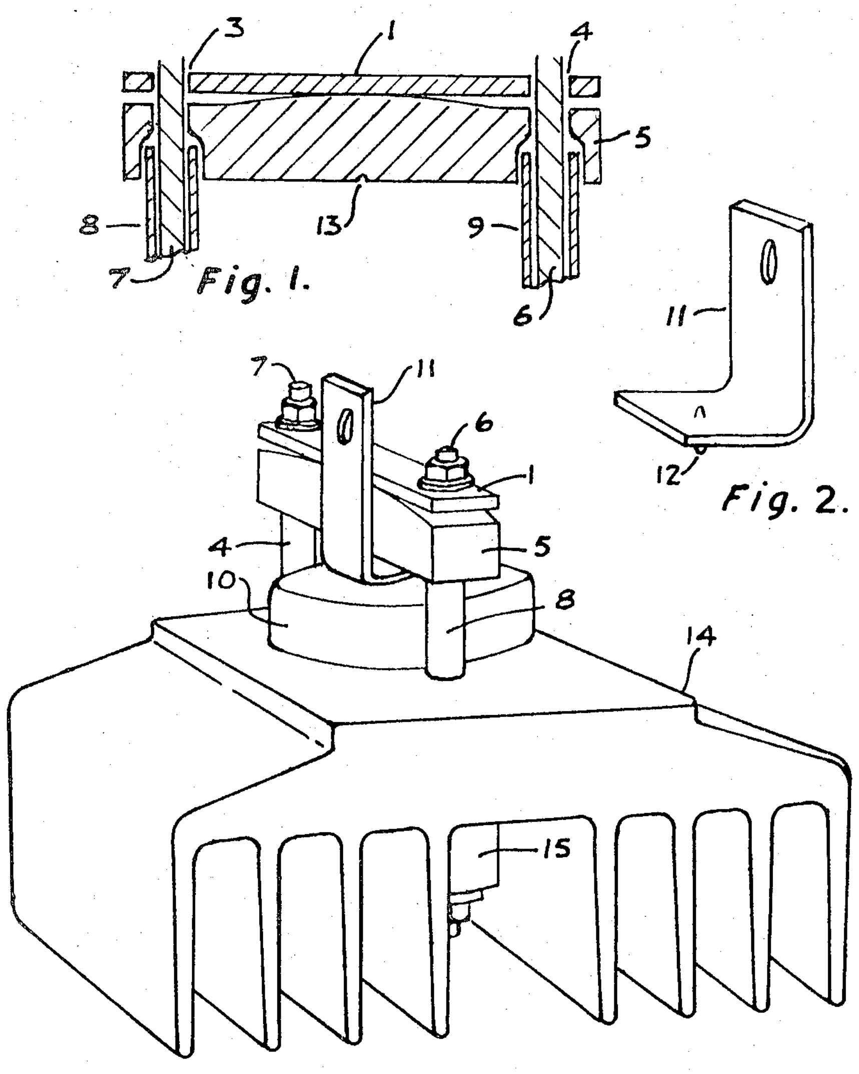
Figure 4:
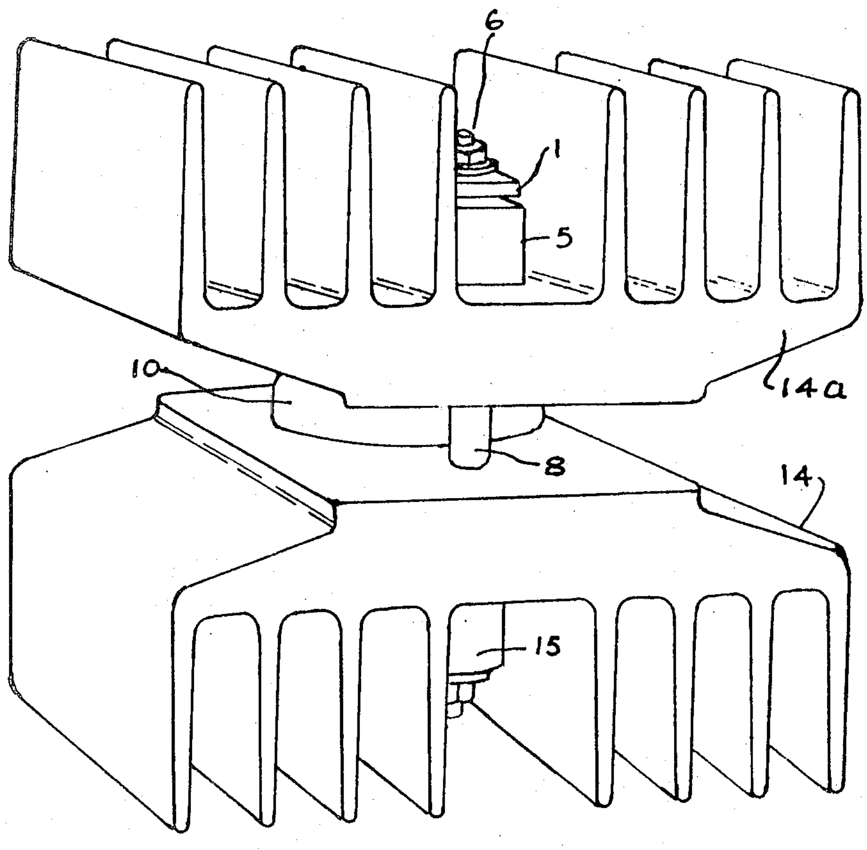

In order that the invention may be more clearly understood and readily carried into effect, the same will be further described by way of example with reference to the accompanying drawings in which:

FIG. 1 illustrates a section through a part of a mounting in accordance with the invention, FIG. 2 illustrates a conducting contact cooperable with the part shown in FIG. 1, FIG. 3 illustrates in perspective view one application of a mounting in accordance with the invention and FIG. 4 illustrates a further application in perspective view of a mounting in accordance with the invention.

Referring to FIG. 1 this illustrates a leaf spring 1 having holes 3 and 4 at the outer ends and the intermediate part thereof bearing on the upper surface of a block 5 the upper surface being convex such as to provide a clearance between the ends of the leaf and spring and the ends of the block when the leaf spring is drawn into compression against the block by tensioning means represented by the rods 6 and 7 as shown. The tensioning means 6 and 7 are assumed to be threaded at the ends to enable them to be drawn up by nuts against the spring 1 on the one hand and against the lower surface of a metallic heat sink on the other hand. FIG. 3 shows a semiconductor device of the capsule type mounted on a heat sink 14 by the use of the mounting arrangement shown in FIG. 1.

In FIG. 3, the elements referred to in relation to FIG. 1 are given similar reference numerals for ease of identification. Thus the leaf spring 1 is clamped by studs 6 and 7 with suitable washers against the upper convex surface of the insulating block 5. The block 5 is counterbored to enable the insertion of insulating sleeves and these are visible as references 8 and 9 in FIG. 3 and FIG. 1. Between the lower surface which is substantially planar of the block 5 and the upper contact of a capsule type device 10 there is clamped a contact bracket represented by the reference 11 and the shape of which is more readily visible from FIG. 2. From FIG. 2 it will be seen that the bracket has included therein a pressed-in pin 12. This pin engages with a small hole in the lower surface of the block 5 on the one hand and a small hole in the center of the upper contact of the device 10, the latter contact not being visible. However, it will be appreciated that by virtue of the pressed-in pin 12 locating the holes in 13 and the upper contact of 10, precise location of the device 10 in position is achieved. The tension means 6 and 7 pass through the respective insulating sleeves 8 and 9 which provide electrical isolation from a heat sink 14 through which they also pass into a further insulating block 15 to engage with washers and nuts on the lower ends.

Clearly visible in FIG. 3 and FIG. 1 is the existence of a clearance between the upper surface of the insulating block 5 and the outer ends of the leaf spring 1. These clearances and the fact that easy access to these clearances is provided by the nature of the construction of the arrangement enable the insertion of feeler gauges and when a predetermined clearance is achieved on tensioning of the tension means, a predetermined deflection of the spring 1 is so manufactured as to have a substantially consistent rating within its batch and accordingly a predetermined pressure is thereby applied by the contact bracket 11 and the upper surface of the hat sink 14 to the semiconductor capsule device 10. Accordingly, optimum operating conditions for the device may be achieved in a relatively simple manner.

Referring to FIG. 4, this illustrates the use of a mounting in accordance with the invention for application to a double sided cooling arrangement for a device such as the capsule device 10 as shown in FIG. 3. In this case, again corresponding components have been allocated the same reference numerals and it will readily be seen that the position of the contact bracket 11 is now taken by the upper heat sink 14*a* and the insulating sleeves are permitted to pass right through heat sinks thereby isolating the tensioning rods 6 and 7 from the upper and lower heat sinks which are at the upper and lower contact potentials of the device 10. No further discussion of the arrangement of FIG. 4 appears to be necessary.

Whilst a specific manner of putting the invention into practice has been described in the foregoing in relation to the various illustrations, the intention is not specifically restricted to these particular arrangements. For example, by arranging for the tensioning means to be disposed at an intermediate point on the leaf spring, an arrangement employing a similar concept to that illustrated in FIG. 1 may be operated to employ a single tensioning rod for a pair of devices mounted between the respected ends of the leaf spring or insulating block and a base member, the latter normally being a heat sink.

Again, whilst the contact bracket 11 is provided with a pressed-in pin 12, a similar arrangement may be envisaged in which the bracket 11 is provided with a hole to locate a suitable pip provided on the lower surface of the block 5 and the upper contact of the device 10. Again, the bracket 11 may be stamped to provide a hole in one surface thereof and a pip in the other to cooperate with a complementary pip and a complementary hole in the block 5 and the upper contact of the device 10 or vice versa.

We claim:

1. A mounting for a semiconductor device comprising a base member, a block having a convex surface, a leaf spring which produces a predetermined pressure at a point along the length thereof as a result of a given deflection and said point, and means for mounting said spring in engagement with said convex surface of said block such that a gap exists between said surface and said spring and for tensioning said spring so as to clamp said semiconductor device between said block and said base member, such that the gap between said surface and said spring is accessible during application of tension to said tensioning means so that a predetermined deflection of the spring can be gauged and a selected pressure thus applied to the semiconductor device.

2. A mounting as claimed in claim 1 wherein said block comprises a block of electrically insulating material for insulating the spring from an adjacent face of the semiconductor device.

3. A mounting as claimed in claim 1 further comprising a contact member clamped between the block and the device for providing an electrical connection to the device.

4. A mounting as claimed in claim 3 wherein said contact member includes means for cooperating with means on the block and the device to locate said device, said contact member and said block with respect to one another 5. A mounting device as claimed in claim 1 wherein said base member comprises a heat sink for the semiconductor device.

6. A mounting as claimed in claim 5 further comprising a further heat sink interposed between the block and said semiconductor device.

* * * * *